US012803587B2

(12) United States Patent
Jaussaud

(10) Patent No.: US 12,803,587 B2
(45) Date of Patent: Nov. 17, 2026

(54) METHOD FOR PERFORMING ENCODING FORMAT CONVERSION WITH INTEGER ARITHMETIC OPERATIONS AND SYSTEM THEREFOR

(71) Applicant: ADATA TECHNOLOGY CO., LTD., New Taipei City (TW)

(72) Inventor: Jérémy Nicolas Jaussaud, Taipei (TW)

(73) Assignee: ADATA TECHNOLOGY CO., LTD., New Taipei City (TW)

( * ) Notice: Subject to any disclaimer, the term of this patent is extended or adjusted under 35 U.S.C. 154(b) by 98 days.

(21) Appl. No.: 18/921,219

(22) Filed: Oct. 21, 2024

(65) Prior Publication Data

US 2025/0226839 A1 Jul. 10, 2025

(30) Foreign Application Priority Data

Jan. 8, 2024 (TW) ................................ 113100673

(51) Int. Cl.
*H03M 7/30* (2006.01)
*H03M 7/24* (2006.01)

(52) U.S. Cl.
CPC ........... *H03M 7/6011* (2013.01); *H03M 7/24* (2013.01)

(58) Field of Classification Search
CPC .............................. H03M 7/24; H03M 7/6011
USPC ........................................................... 341/50
See application file for complete search history.

(56) References Cited

U.S. PATENT DOCUMENTS

| | | | | |
|---|---|---|---|---|
| 10,666,985 | B1 | 5/2020 | Cheong | |
| 11,387,843 | B1 | 7/2022 | Huang | |
| 2003/0014453 | A1* | 1/2003 | Challa | G06F 1/0356 708/277 |
| 2005/0138101 | A1 | 6/2005 | Tang | |
| 2021/0019116 | A1* | 1/2021 | Sun | G06F 7/556 |

FOREIGN PATENT DOCUMENTS

| | | | | |
|---|---|---|---|---|
| KR | 3474194 | * 4/2019 | G06N 3/035 | |
| TW | 202247188 A | 12/2022 | | |

* cited by examiner

*Primary Examiner* — Peguy Jean Pierre
(74) *Attorney, Agent, or Firm* — Li & Cai Intellectual Property (USA) Office

(57) ABSTRACT

A method for performing encoding format conversion with integer arithmetic operations and a system performing the method are provided. The system includes a target device that adopts a power-management bus (PMBus), and operates an embedded system that is only capable of integer arithmetic operation without any floating-point unit. In the method, a floating-point arithmetic encoding format value is inputted. After a logarithm value of the floating-point value is obtained by extracting an exponent value from a binary representation of the floating-point value, a new exponent value can be obtained through a control flow. A new mantissa value is then calculated according to the floating-point value, the exponent value and the new exponent value. A new value that is a linear encoding format value converted from the floating-point arithmetic encoding format value is generated by combining the new exponent value and the new mantissa value.

19 Claims, 3 Drawing Sheets

METHOD FOR PERFORMING ENCODING FORMAT CONVERSION WITH INTEGER ARITHMETIC OPERATIONS AND SYSTEM THEREFOR

CROSS-REFERENCE TO RELATED PATENT APPLICATION

This application claims the benefit of priority to Taiwan Patent Application No. 113100673, filed on Jan. 8, 2024. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an algorithm and a circuitry for encoding and decoding, and more particularly to a method for performing encoding format conversion by applying capability of integer arithmetic operation in a power-management bus and a system for performing the same.

BACKGROUND OF THE DISCLOSURE

IEEE 754 standard is widely used for binary floating-point number arithmetic. The IEEE 754 standard regulates four expression forms of floating-point numbers that include single precision (the primary form), double precision, extended single precision and extended double precision.

A floating-point number includes an exponent portion and a mantissa portion. The exponent portion indicates a power of the floating-point number, and the mantissa portion indicates a decimal part of the floating-point number. The floating-point number encoded by the IEEE 754 standard is a combination of a binary exponent and a mantissa.

It is well understood that the floating-point operation is generally required to be performed by a powerful float-point unit and consumes computing resources. However, the processors of most embedded systems do not have the float-point unit and therefore cannot perform the floating-point operation. For example, rather than the IEEE 754 encoding format, the system adopting a power-management bus (PMBus) generally uses a Linear11 encoding format and is incapable of performing floating-point operations.

SUMMARY OF THE DISCLOSURE

In response to the above-referenced technical inadequacy, the present disclosure provides a method for performing encoding format conversion with integer arithmetic operation and a system for performing floating-point decoding/encoding on an electronic device that can only perform integer arithmetic operation.

In an aspect of the present disclosure, the system provides a target device that includes a control unit, a decoder-encoder and a power-controlling circuit that are interconnected via a power-management bus. The control unit is used to perform the method for performing encoding format conversion with integer arithmetic operation.

In the method for performing encoding format conversion with integer arithmetic operation, a floating-point value encoded in compliance with the IEEE 754 standard is inputted. An exponent value that is encoded into the floating-point value is obtained so as to acquire a new exponent value. A new mantissa value is then calculated according to the floating-point value, the exponent value extracted from the floating-point value and the new exponent value. If the new mantissa value is between −1024 and 1024, a control flow is performed to detect mantissa overflow. Next, a new value is formed by combining the new exponent value and the new mantissa value. The new value is a linear encoding format value converted from the floating-point value.

In another aspect of the present disclosure, an embedded system is used to operate the target device, and more particularly, the embedded system does not include any float-point unit but is only able to perform integer arithmetic operation, namely, the target device can only support linear encoding format (i.e., Linear11).

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
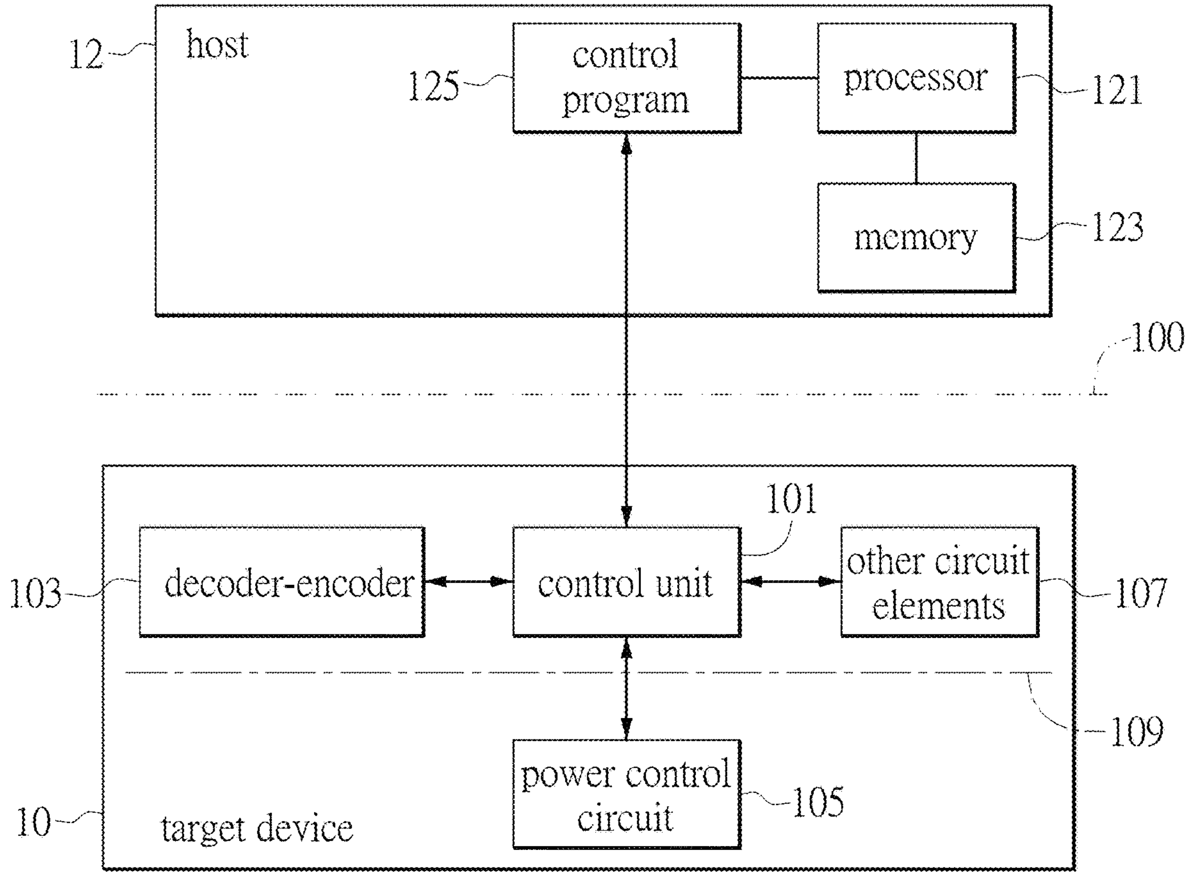
FIG. 1 is a schematic diagram illustrating a framework of a system for operating a method for performing encoding format conversion with integer arithmetic operation according to one embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

In general, floating-point operation requires a more powerful processor which means higher-cost hardware is required to perform floating-point operation. The device adopting an embedded system, e.g., an IoT (Internet of Things), does not use floating-point operation and does not include a floating-point unit (FPU). The present disclosure provides a method for performing encoding format conversion with integer arithmetic operation that is operated in a system that can be a circuit system or a software system. According to one of the embodiments of the present disclosure, the system is installed in a target device that adopts a power-management bus and has the embedded system which is only capable of integer arithmetic operation without any floating-point unit installed. When the system operating the method for performing encoding format conversion with integer arithmetic operation is installed in the target device, the target device is able to perform complex decoding-encoding operations through the embedded system. The present disclosure provides a solution for an electronic device that is originally designed to only handle integer arithmetic operation to perform floating-point operation.

According to an embodiment of the present disclosure that relates to the system applying the method for performing encoding format conversion with integer arithmetic operation, the system indicates a system adopting a power-management bus (PMBus), and the system can be used in an electronic device with a limited processing capability. The system that adopts the power-management bus can perform a linear decoding operation such as Linear11 in a software manner, but cannot perform the IEEE 754 encoding format since the system is incapable of performing floating-point operation. The linear encoding format is such as Linear11 or Linear16. The above-mentioned linear encoding formation 11 (i.e., Linear11) supported by the decoding-encoding operation indicates a numerical value consisting of a mantissa having 11 digits and an exponent having 5 digits that are adapted to integer arithmetic operation.

In the method for performing encoding format conversion with integer arithmetic operation, an arithmetic operation used to perform encoding format conversion between a linear encoding format (e.g., Linear11) and a floating-point arithmetic encoding format (e.g., IEEE 754-defined encoding formats). The arithmetic operation is an integer arithmetic operation and the operation is preferably applied to the electronic device adopting PMBus. The electronic device adopting PMBus is characterized by having low computing capability and is not used for floating-point operation.

Based on the above-described inventive concept, in a practical operation, the method allows conversion of an integer-encoded numerical value (e.g., a Linear11-encoded numerical value) to a binary-encoded numerical value (e.g., an IEEE 754-encoded numerical value), and conversion of a Binary16 or Binary 32-encoded numerical value to a Linear11-encoded numerical value. On the contrary, the method allows decoding of the Linear11-encoded numerical value to a Binary16 or Binary32-encoded numerical value that is format of the IEEE 754. It should be noted that only integer arithmetic operation is used in the above-described conversion process.

Reference is made to FIG. 1, which is a schematic diagram illustrating a framework of a system performing the method for performing encoding format conversion with integer arithmetic operation according to one embodiment of the present disclosure.

The system provides a target device 10. Main circuit components of the system include a control unit 101, a decoder-encoder 103, a power-controlling circuit 105 and other circuit elements 107 that are electrically interconnected. The target device 10 particularly adopts an electronic device adopting a power-management bus (PMBus) 109.

The control unit 101 is used to perform the method for performing encoding format conversion with integer arithmetic operation of the present disclosure by a firmware. The control unit 101 is composed of multiple logic circuits in the electronic device. The firmware can be implemented by a micro-controlling unit (MCU). The control unit 101 and the power-controlling circuit 105 are interconnected via a power-management bus 109. The control unit 101 is connected with the other circuit elements 107 of the target device 10. For example, the control unit 101 is connected with, but not limited to, the power-controlling circuit 105, a communication module (not shown in the diagram), a memory module (e.g., EEPROM, flash memory, etc., that are not shown in the diagram) and various output/input interfaces (not shown in the diagram) via the power-management bus 109. The method for performing encoding format conversion with integer arithmetic operation performed in the control unit 101 of the system is used to perform conversion between linear encoding format (e.g., Linear11) and floating-point arithmetic encoding format (e.g., Binary16/Binary32) in the decoder-encoder 103. For example, the Linear11 encoding format is converted to Binary32 encoding format, or vice versa.

The target device 10 is controlled by a host 12. The host 12 includes a processor 121 and a memory 123. The processor 121 is configured to perform a controlling program 125 that is used to control operations of the target device 10, for example, the decoding and encoding procedures, and perform decoding and driving on the target device 10. The target device 10 and the host 12 are interfaced via a human machine interface 100. Preferably, the human machine interface 100 is operated in compliance with a human interface device protocol (HID protocol), by which the target device 10 is controlled to operate the method for performing encoding format conversion with integer arithmetic operation.

It should be noted that the target device 10 adopting the power-management bus 109 can be operated via an embedded system. The target device 10 generally does not include a floating-point unit, but is capable of performing integer arithmetic operation. Through the method for performing encoding format conversion with integer arithmetic operation, the target device 10 is able to interface with a wider range of devices by supporting floating-point inputs and outputs.

The linear encoding format is such as Linear11 operated in a processor of a device adopting a power-management bus. The value in linear encoding format is composed of an exponent ("E") and a mantissa ("M"). The floating-point arithmetic encoding format can be the common binary floating-point number in compliance with IEEE 754. The floating-point arithmetic encoding format is generally known as Binary16 or Binary32 encoding format. The value encoded in compliance with IEEE 754 is composed of an exponent ("E") and a mantissa ("M").

According to certain embodiments of the present disclosure, the power-management bus 109 can only operate the linear encoding format, e.g., Linear11 encoding format. The method for performing encoding format conversion with integer arithmetic operation can be operated by software. The algorithm used to convert between two different encoding formats. For example, the Binary16/Binary32 encoding format is encoded to Linear11 encoding format and the Linear11 encoding format can be converted to Binary16/Binary32 encoding format. The algorithm operated in the target device 10 only adopts integer arithmetic operation.

Figure 2:
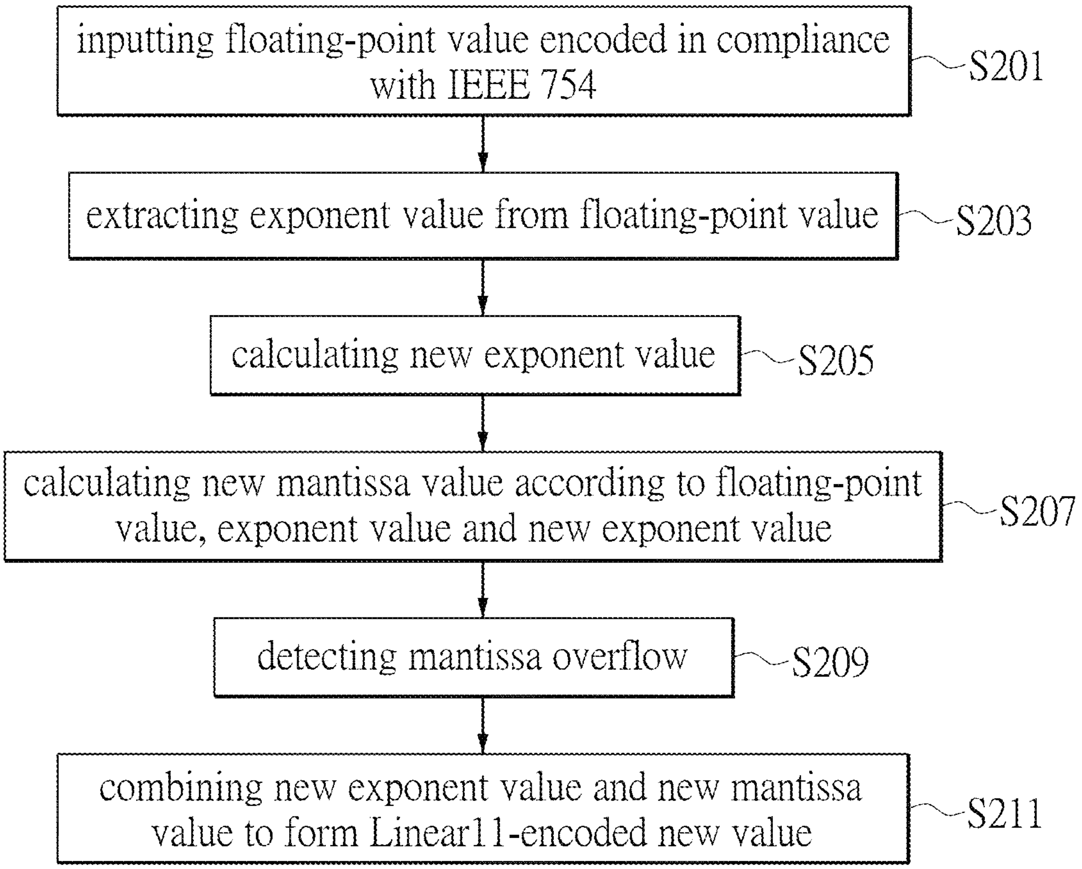
FIG. 2 is a flowchart illustrating a main conceptual process of the method for performing encoding format conversion with integer arithmetic operation according to one embodiment of the present disclosure.

According to the embodiment relating the method for performing encoding format conversion with integer arithmetic operation operated in the target device 10, the method can be performed in an embedded system without the floating-point unit, and, as illustrated in a flowchart shown in FIG. 2, the embedded system can be used to perform format conversion between linear encoding format and floating-point arithmetic encoding format.

The above-mentioned system is such as a circuit system or a software system operated in an electronic device. When the system performs the method for performing encoding format conversion with integer arithmetic operation, a floating-point value ("f") that is encoded by a floating-point arithmetic encoding format is inputted to the system via a specific transmission interface (step S201). The floating-point value can be in compliance with the IEEE 754 encoding format.

Next, through a computing circuit of the system (e.g., the control unit of the electronic device), an exponent value is extracted from the floating-point value in a binary format so as to obtain a logarithm value of the floating-point value (step S203). It should be noted that the logarithm value can be expressed by "ln(x)" or "$\log_e(x)$" that is a logarithmic function using an Euler's number "e" as a base.

After that, a new exponent value ("E") is calculated. It should be noted that the new exponent value can be calculated based on a similarity between floating-point arithmetic encoding format and linear encoding format. In an aspect of the present disclosure, when the floating-point arithmetic encoding format value is obtained by the above steps, a larger one of exponent values "−16" and "L−9" can be used as the new exponent value ("E") (step S205). The system then relies on the floating-point value, the exponent value and the new exponent value to calculate a new mantissa value (step S207).

According to one of the embodiments of the present disclosure, the new exponent value is a maximum between the numerical values "−16" and "L−9", in which "L" denotes a logarithm of the floating-point value. The new mantissa value can be expressed by "M." When the new exponent value ("E") is calculated, the new mantissa value ("M") is between "−1024" and "1024." In an aspect of the present disclosure, the new mantissa value can be an integer value that is closest to "$2^{-E}$*f." For example, the new mantissa value can be the integer that is rounded up or down from a non-integer closest to "$2^{-E}$*f", wherein "f" denotes an inputted floating-point value in compliance with a floating-point arithmetic encoding format, and the new mantissa value ("M") can be calculated by equation 1:

$$|M| = \left(2^{23} + \left(u \,\&\left(2^{23} - 1\right)\right) + 2^{22-L+E}\right) >> (23\_\mathrm{L} + E). \quad \text{Equation 1}$$

In equation 1, the symbol "&" denotes a bitwise "AND"; the symbol ">>" denotes shifting a bit to a least significant bit (LSB), and the numerical value "u" denotes a binary value of the floating-point value.

The new exponent value and the new mantissa value can be obtained through the above steps. Further, when the new mantissa value is calculated, the system performs a control flow for processing special conditions by the control unit, for example, detecting mantissa overflow (step S209).

The control flow can apply a specific processing rule that can be referred to in the following embodiments for performing a floating-point operation in an integer arithmetic operation so as to generate a new value. Thus, a Linear11-encoded new value is generated by combining the new exponent value and the new mantissa value (step S211). The outputted new value is a linear encoding format value converted from the floating-point value, and the new value is an integer.

Further, the logarithm value obtained by the above steps can be used to acquire an order of magnitude of the inputted floating-point arithmetic encoding format value. If the inputted floating-point value is a not-a-number (NaN) value, an infinite value or a number outside a representable range, a new value in compliance with the linear encoding format is outputted. According to one embodiment of the system that outputs the new value, "L" denotes a logarithm of the floating-point value that exceeds a representable range, and following steps are performed. If "L" is smaller than the representable range, it shows that the value of the inputted floating-point arithmetic encoding format value is too small, and an outputted exponent value is set to zero; if "L" is larger than the representable range, it shows that the value of the inputted floating-point arithmetic encoding format value is too large. In this situation, if the inputted value is a not-a-number (NaN) value, the outputted exponent value is set to zero; if the inputted value is a positive number, the outputted exponent value is set to a maximum representable value; and, otherwise, the outputted exponent value is set to a minimum representable value.

Still further, if the inputted floating-point arithmetic encoding format value is not a "NaN", which is not a value that cannot be clearly defined, this means that the inputted floating-point arithmetic encoding format value is an understandable numerical value and can be a value that cannot be an infinite value or any value outside a representable range. It should be noted that the inputted binary value in compliance with the floating-point arithmetic encoding format can be determined to output a highest or a lowest value according to a sign bit of the inputted binary value. Thus, the floating-point arithmetic encoding format value can be converted to be the linear encoding format value without using the floating-point unit and with the correct rounding.

The other processes are as follows. According to certain embodiments, a bit number of the mantissa value of the initial inputted floating-point arithmetic encoding format value (e.g., an IEEE 754 encoding format value) is denoted as “NMB”, for example, a Binary32 format value is “23”, and a Binary11 format value is “11.” The bit number “NMB” of the mantissa value is inputted to equation 2.

$$|M| = ((1 << NMB) + M + (1 << (NMB - 1 - L + E))) >> (NMB - L + E). \quad \text{Equation 2}$$

In equation 2, “|M|” denotes an absolute value of the mantissa value “M”; “<<” denotes shifting to a most significant bit (MSB); and “>>” denotes shifting to least significant bit (LSB). A first term of equation 2 corresponds to an exponent value, and a second term of equation 2 corresponds to the mantissa value, and a third term of equation 2 is one half. An output value is obtained after rounding off a sum of the above terms of equation 2.

According to one embodiment of the control flow described in step S209, the new mantissa value is still expressed by “M”, and the new exponent value is expressed by “E.” It should be noted that the mantissa value of the floating-point arithmetic encoding format value is between “−1024” and “1024” that can be expressed by “[−1024, 1024].” However, since the mantissa value (“M”) “1024” cannot be encoded by the linear encoding format (e.g., Linear11), a problem of overflow may occur, and therefore the control flow is required to process the mantissa value when it is “1024.” The control flow processing the mantissa value (“M”) is as follows.

In the control flow, if the mantissa value “M” is smaller than 1024, the new value is “$2^{11}$E+(M & ($2^{11}$−1))” wherein “&” denotes a bitwise “AND”; if the mantissa value “M” is equal to “1024” and the exponent value “E” is smaller than “15”, the new value is “$2^{11}$E+2560”; and, if the mantissa value “M” is equal to “1024” and the exponent value “E” is larger and equal to “15”, the new value is a maximum representable value.

Scenario 1: in most instances, the mantissa value “M” is smaller than “1024”, and the new mantissa value is determined as “(E<<11)|M”, wherein “<<” denotes shifting to a most significant bit (MSB). After that, the exponent value and the mantissa value can be directly combined.

Scenario 2: if the mantissa value “M” is equal to “1024” and the exponent value “E” is smaller than “15”, the output is “(E<<11)+2560.” Since the linear encoding format (e.g., Linear11) cannot process the mantissa value “M” when it is “1024”, the new mantissa value “M” is determined as “512”, the exponent value “E” is determined as “E+1” instead, and then the exponent value is combined with the mantissa value.

Scenario 3: if the mantissa value “M” is equal to “1024” and the exponent value “E” is larger than and equal to “15”, the new mantissa value is determined as a maximum representable value since the mantissa value “M” “1024” cannot be processed by the linear encoding format (e.g., Linear11).

Figure 3:
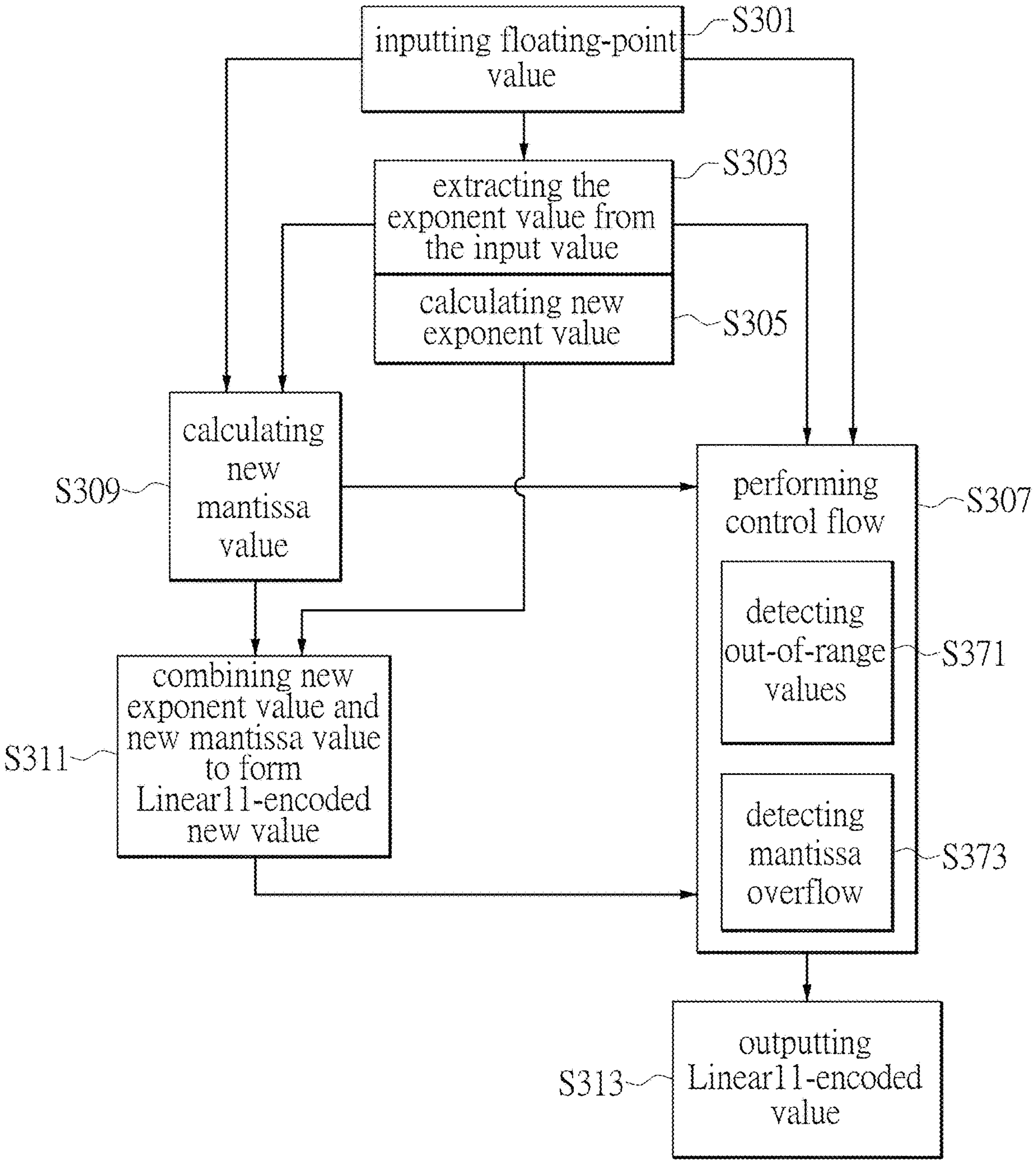
FIG. 3 is another flowchart further illustrating the method for performing encoding format conversion with integer arithmetic operation according to another embodiment of the present disclosure.

Reference is next made to FIG. 3, which is another flowchart illustrating the method for performing encoding format conversion with integer arithmetic operation according to another embodiment of the present disclosure.

According to the system framework shown in FIG. 1, the host 12 controls computing procedures running in the target device 10 via the human machine interface 100. A floating-point value in compliance with the floating-point arithmetic encoding format is inputted to the target device 10, and the control unit converts the floating-point arithmetic encoding format value to the linear encoding format value (step S301).

Referring to the flowchart shown in FIG. 2, a logarithm value of the floating-point arithmetic encoding format value is calculated and an exponent value is extracted from the inputted value (step S303). Alternatively, the control flow is required to process a specific condition that, for example, an order of magnitude of the floating-point arithmetic encoding format value is determined as out-of-range according to the logarithm value, namely, the control flow is used to process the exponent value or the mantissa value that is out of range (step S307), and a corresponding new exponent value is outputted (step S305).

According to the embodiments being illustrated in FIG. 2 and FIG. 3, such as in the control flow of step S307, the control flow is used to determine if any value is out of range (step S371) and if any value overflows, said any value meaning the mantissa value in particular (step S373).

For example, in step S371, an order of magnitude of the floating-point arithmetic encoding format value can be obtained from the logarithm value. The floating-point arithmetic encoding format value is too small if the logarithm value is determined to be too small, and the new exponent value is 0; and the floating-point arithmetic encoding format value is too large if the logarithm value is determined too large, and the new exponent value is 15. The control flow also checks whether or not any value cannot be clearly defined.

Next, the new mantissa value can be calculated based on the floating-point arithmetic encoding format value (step S309), and, in an aspect of the present disclosure, the new mantissa value is an integer closest to “$2^{-E}$*f”, wherein “E” denotes a new exponent value and “f” is a floating-point arithmetic encoding format value.

In another aspect of the present disclosure, if the new mantissa value is between “−1024” and “1024” and in a special condition where the mantissa value “1024” cannot be processed by linear encoding format, the control flow is used to determine the new mantissa value as described in FIG. 2 above the above-mentioned scenarios 1, 2 and 3.

Afterwards, the new value is obtained by combining the new exponent value and the new mantissa value, and is converted from the floating-point arithmetic encoding format value into the linear encoding format (e.g., Linear11 encoding format) (step S311). Finally, a linear encoding format (i.e., Linear11) value is outputted (step S313).

In conclusion, according to the above embodiments, rather than the conventional electronic device adopting the power-management bus being incapable of processing the floating-point operation that will consume computing resources, it is possible in the method for performing encoding format conversion with integer arithmetic operation to perform format conversion between different encoding formats without floating-point operation and therefore be adapted to an electronic device adopting the power-management bus. The software operated in the electronic device is able to decode and encode the values in compliance with both the Linear11 and IEEE 754 encoding formats by performing the integer arithmetic operation for processing the numerical operations that originally require a floating-point unit. Further, the method allows the circuit system to save computing resources and can therefore be adapted to the electronic device with lower computing capability and a field programmable gate array (FPGA) circuit.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A method for performing encoding format conversion with an integer arithmetic operation, wherein the method is performed in a system that is disposed in a target device and the target device is operated with an embedded system not including a floating-point unit and being only capable of the integer arithmetic operation, the method comprising:

inputting a floating-point value encoded in compliance with IEEE 754 standard to the system that is disposed in the target device adopting a power-management bus;

extracting an exponent value that is originally encoded to the floating-point value from the floating-point value so as to obtain a new exponent value;

calculating a new mantissa value according to the floating-point value, the exponent value being extracted from the floating-point value and the new exponent value; and combining the new exponent value and the new mantissa value so as to form a new value, wherein the new value is a linear encoding format value converted from the floating-point value.

2. The method according to claim 1, wherein the exponent value is extracted from the floating-point value that is represented by a binary code so as to obtain a logarithm of the floating-point value.

3. The method according to claim 2, wherein the new exponent value is a maximum between "−16" and "L−9", and wherein "L" denotes a logarithm of the floating-point value.

4. The method according to claim 3, wherein the new mantissa value is an integer closest to "$2^{-E}$f", wherein "E" is the new exponent value, and "f" is the floating-point value;

and the new mantissa value "M" is calculated through an equation:

$$|M| = \left(2^{23} + \left(u \,\&\left(2^{23}-1\right)\right) + 2^{22-L+E}\right) >> (23\_\mathrm{L} + E);$$

wherein "&" denotes a bitwise "AND" operator, and ">>" denotes a bit shift towards a Least Significant Bit (LSB), and "u" is a binary value of the floating-point value.

5. The method according to claim 4, wherein the new mantissa value is between −1024 and 1024.

6. The method according to claim 5, wherein, when the new mantissa value is calculated, a control flow is performed to detect mantissa overflow.

7. The method according to claim 6, wherein the new mantissa value is represented by "M", and the new exponent value is represented by "E"; in the control flow, if "M" is smaller than 1024, the new value is "$2^{11}$E+(M & ($2^{11}$−1))", wherein "&" denotes a bitwise "AND"; if "M" is equal to 1024 and "E" is smaller than 15, the new value is "$2^{11}$E+2560"; and if "M" is equal to 1024 and "E" is larger than or equal to 15, the new value is a maximum representable value.

8. The method according to claim 2, wherein "L" denotes a logarithm of the floating-point value that exceeds a representable range, and processes to be performed include:

if "L" is smaller than the representable range, the outputted exponent value is zero; and if "L" is larger than the representable range, in response to the inputted floating-point value being a not-a-number value, the outputted exponent value is zero; in response to the inputted floating-point value being a positive number, the outputted exponent value is a maximum representable value; otherwise, the outputted exponent value is a minimum representable value.

9. The method according to claim 8, wherein, if the floating-point value is a not-a-number value, an infinite value or a number outside the representable range, the new value in compliance with the linear encoding format is outputted.

10. A system performing a method for performing encoding format conversion with integer arithmetic operation, wherein the system comprises:

a target device, including a control unit, a decoder-encoder and a power-controlling circuit that are interconnected via a power-management bus;

wherein the control unit is used to perform the method for performing encoding format conversion with integer arithmetic operation including:

inputting a floating-point value encoded in compliance with IEEE 754 standard;

extracting an exponent value that is originally encoded to the floating-point value from the floating-point value so as to obtain a new exponent value;

calculating a new mantissa value according to the floating-point value, the exponent value being extracted from the floating-point value and the new exponent value; and combining the new exponent value and the new mantissa value so as to form a new value, wherein the new value is a linear encoding format value converted from the floating-point value.

11. The system according to claim 10, wherein the target device is operated with an embedded system not including any floating point unit and being only capable of integer arithmetic operation.

12. The system according to claim 11, wherein the floating-point operation encoding format specifies a standard of binary floating-point number arithmetic, and the only linear encoding format operated in the target device is Linear11.

13. The system according to claim 10, wherein the control unit performs conversion between a linear encoding format and a floating-point operation encoding format in the decoder-encoder.

14. The system according to claim 10, wherein the exponent value is extracted from floating-point value that is represented by a binary code so as to obtain a logarithm of the floating-point value.

15. The system according to claim 14, wherein, in the method for performing encoding format conversion with integer arithmetic operation, "L" denotes a logarithm of the floating-point value that exceeds a representable range, and processes to be performed include:

if "L" is smaller than the representable range, the outputted exponent value is zero; and if "L" is larger than the representable range, in response to the inputted floating-point value being a not-a-number value, the outputted exponent value is zero; in response to the inputted floating-point value being a positive number, the outputted exponent value is a maximum representable value is a maximum representable value; otherwise, the outputted exponent value is a minimum representable value.

16. The system according to claim 15, wherein, if the floating-point value is a not-a-number value, an infinite value or a number outside the representable range, a new value in compliance with the linear encoding format is outputted.

17. The system according to claim 14, wherein the new exponent value is a maximum between "−16" and "L−9", and wherein "L" denotes a logarithm of the floating-point value.

18. The system according to claim 17, wherein the new mantissa value is an integer closest to "$2^{-E}$f", wherein "E" is the new exponent value and "f" is the floating-point value, and the new mantissa value "M" is calculated through an equation:

$$|M| = \left(2^{23} + \left(u \,\&\left(2^{23} - 1\right)\right) + 2^{22-L+E}\right) >> (23\_\mathrm{L} + E);$$

wherein "&" denotes a bitwise "AND", and ">>" denotes a bit shift towards a Least Significant Bit (LSB) and "u" is a binary value of the floating-point value.

19. The system according to claim 18, wherein, in the method for performing encoding format conversion with integer arithmetic operation, when the new mantissa value that is between −1024 and 1024 is calculated, a control flow is performed to detect mantissa overflow; wherein the new mantissa value is represented by "M"; in the control flow, if "M<1024" then the new value is "$2^{11}$E+(M & ($2^{11}$−1))", wherein "&" denotes a bitwise AND; if "M=1024" and "E<15", then the new value is "$2^{11}$E+2560"; and if "M=1024" and "E≥15", then the new value is a maximum representable value.

* * * * *